United States Patent
Morita et al.

(10) Patent No.: US 9,414,508 B2
(45) Date of Patent: Aug. 9, 2016

(54) ELECTRONIC DEVICE, MOUNTING MEMBER, AND MOUNTING METHOD

(71) Applicant: Kabushiki Kaisha Toshiba, Minato-ku, Tokyo (JP)

(72) Inventors: Herofumi Morita, Higashiyamato Tokyo (JP); Satoru Yasui, Kokubunji Tokyo (JP); Wenhsiang Wu, Fuchu Tokyo (JP); Atsushi Tatemichi, Ota Tokyo (JP); Yasuyuki Suzuki, Tachikawa Tokyo (JP); Masanobu Asano, Ome Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 17 days.

(21) Appl. No.: 14/602,492

(22) Filed: Jan. 22, 2015

(65) Prior Publication Data

US 2016/0066450 A1 Mar. 3, 2016

(30) Foreign Application Priority Data

Aug. 29, 2014 (JP) .................................. 2014-176300

(51) Int. Cl.
*G06F 1/16* (2006.01)
*H05K 5/02* (2006.01)

(52) U.S. Cl.
CPC .................................. *H05K 5/0217* (2013.01)

(58) Field of Classification Search
USPC ............. 248/539, 237, 419, 176.1, 75, 284.1, 248/917, 218.4, 214, 222.11; 362/249.1, 362/382, 216, 202, 203, 204; 455/561, 455/11.1, 575.1, 416; 345/179, 163, 46, 345/1.1, 159, 418, 168; 439/669, 490, 439/607.18, 607.01, 709, 712, 453, 507, 439/541.5; 361/679.02, 679.21, 679.39, 361/679.01, 679.27, 679.4, 679.32, 679.06, 361/679.33
See application file for complete search history.

(56) References Cited

U.S. PATENT DOCUMENTS

| 6,459,587 B1 * | 10/2002 | Chan .................... H05K 7/1038 174/255 |
| 2009/0193646 A1 * | 8/2009 | Wu .......................... H04B 1/08 29/602.1 |
| 2011/0116229 A1 * | 5/2011 | Hsieh ...................... G06F 1/185 361/679.58 |

FOREIGN PATENT DOCUMENTS

| JP | 6-050395 | 2/1994 |
| JP | 11-317586 | 11/1999 |

* cited by examiner

*Primary Examiner* — Hung Duong
(74) *Attorney, Agent, or Firm* — Knobbe, Martens, Olson & Bear, LLP

(57) ABSTRACT

According to one embodiment, device includes first wall, first base, mount, module, and first and second combining portions. First base protrudes from first wall in thickness direction. First base includes first opening. Mount includes second base and second wall. Second base includes second opening toward first wall. Second wall extends from one side of second base located farther from first wall in the direction to one side of first base located farther from first wall in the direction. Second wall includes third opening which overlaps first opening. Module includes third wall and body. Third wall is located at another side of second base. Third wall includes fourth opening which overlaps second opening. Body is apart from second base. First combining portion penetrates through fourth opening and is inserted into second opening. Second combining portion penetrates through third opening and is inserted into first opening.

12 Claims, 7 Drawing Sheets

ELECTRONIC DEVICE, MOUNTING MEMBER, AND MOUNTING METHOD

CROSS-REFERENCE TO RELATED APPLICATIONS

This application is based upon and claims the benefit of priority from Japanese Patent Application No. 2014-176300, filed Aug. 29, 2014, the entire contents of which are incorporated herein by reference.

FIELD

Embodiments described herein relate generally to an electronic device, a mounting member, and a mounting method.

BACKGROUND

Conventionally, there has been known electronic devices in which a module housed in a housing is fixed to a boss provided in the housing by a combining portion.

It is preferred that such electronic devices have a structure in which the thickness of the housing is reduced.

BRIEF DESCRIPTION OF THE DRAWINGS

A general architecture that implements the various features of the invention will now be described with reference to the drawings. The drawings and the associated descriptions are provided to illustrate embodiments of the invention and not to limit the scope of the invention.

DETAILED DESCRIPTION

In general, according to one embodiment, an electronic device comprises a housing, a first wall in the housing, a first base, a mount, a module, a first combining portion, and a second combining portion. The first base protrudes from the first wall in a thickness direction of the first wall. The first base comprises a first opening along the thickness direction. The mount comprises a second base and a second wall. The second base is spaced apart from the first base. The second base comprises a second opening toward the first wall and along the thickness direction. The second wall extends from one side of the second base located farther from the first wall in the thickness direction to one side of the first base located away from the first wall in the thickness direction. The second wall comprises a third opening which overlaps with the first opening. The module comprises a third wall and a body. The third wall is located at another side of the second base located nearer to the first wall in the thickness direction. The third wall comprises a fourth a fourth opening which overlaps with the second opening. The body is spaced apart from the second base. The first combining portion penetrates through the fourth opening and is inserted into the second opening, and is configured to combine the module and the mount with each other. The second combining portion penetrates through the third opening and is inserted into the first opening, and is configured to combine the mount and the first base with each other.

The following describes an embodiment of the present invention with reference to the accompanying drawings. The configuration of the embodiment and the operations, results, and advantageous effects resulting therefrom are provided merely for exemplary purpose and not limiting. Furthermore, in the drawings, directions (X direction, Y direction, and Z direction) are illustrated for convenience. The X direction is a longitudinal direction on a wall $3k$ of a housing 3 viewed from the front (referred to as a plan view in the embodiment), the Y direction is a lateral direction on the wall $3k$ of the housing 3 viewed from the front (the plan view), and the Z direction is a thickness direction of the housing 3. The X direction, the Y direction, and the Z direction are orthogonal to one another.

An electronic device 1 according to the present embodiment serves as, for example, a personal computer, a television set, a smart phone, a smart book, a mobile phone, and a personal digital assistant (PDA), with a slate-type or a tablet-type display device comprising a function of a software keyboard. These are provided merely for exemplary purpose and not limiting. Examples of the electronic device 1 in the embodiment include a smart phone, a smart book, a mobile phone, a PDA, an image display apparatus, a video phone, an image display controller, an information storage device.

Figure 1:
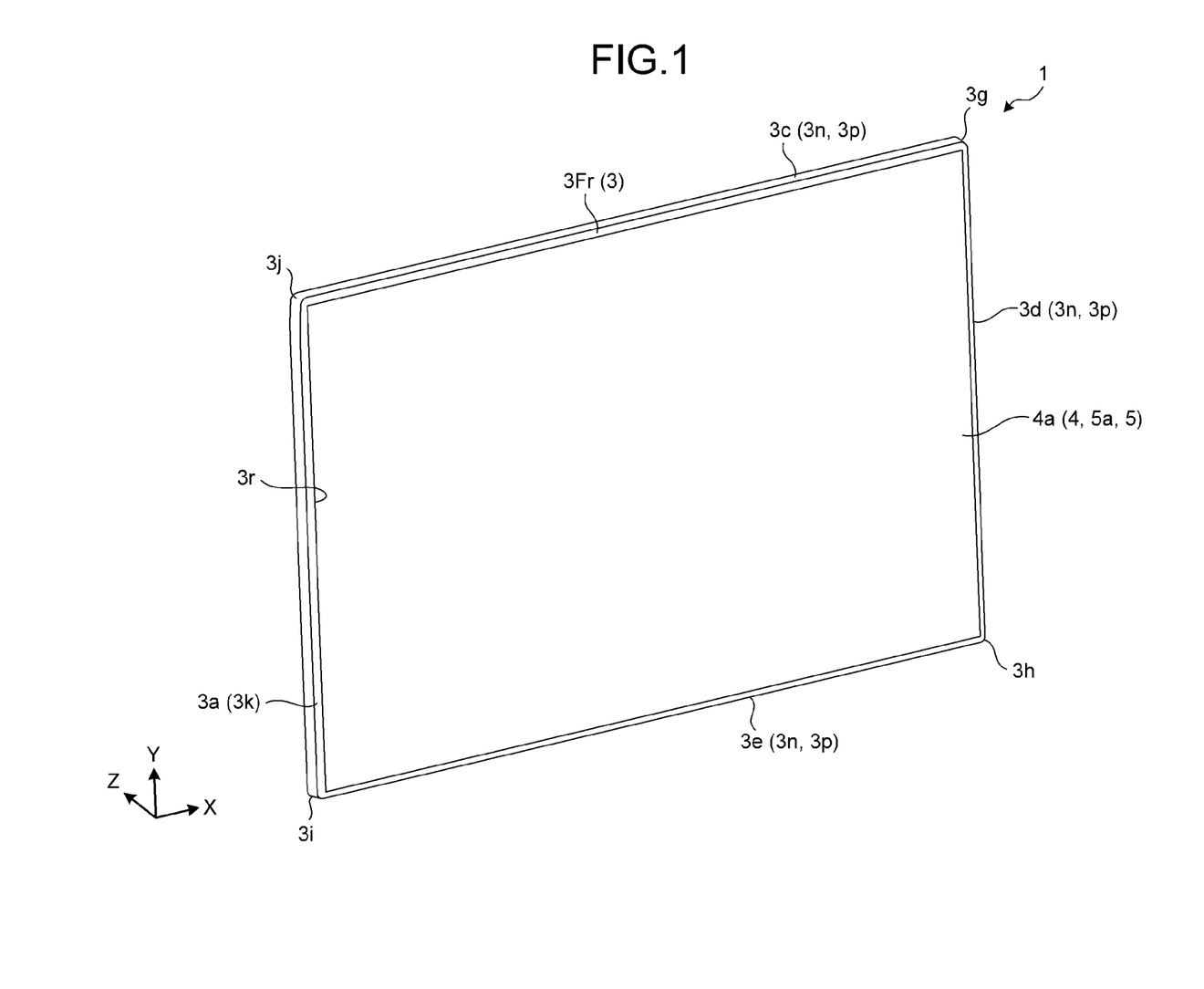
FIG. 1 is an exemplary perspective view of an electronic device when viewed from a front side thereof, according to an embodiment.
Figure 2:
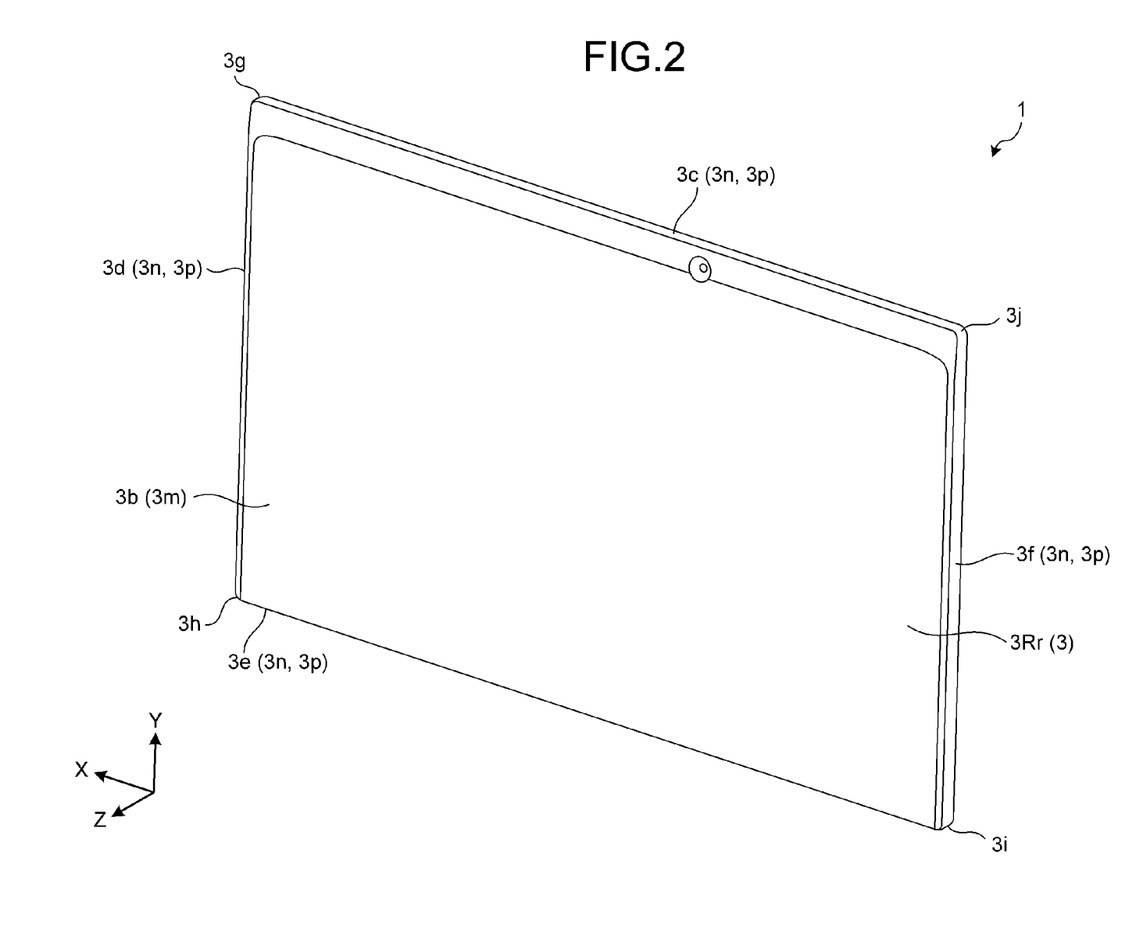
FIG. 2 is an exemplary perspective view of the electronic device when viewed from a back side thereof, in the embodiment.

As illustrated in FIGS. 1 and 2, the housing 3 of the electronic device 1 has an appearance of a substantially quadrangular shape (a rectangular shape as an example, in the embodiment) when viewed from the front or back thereof, for example, in the embodiment. The housing 3 is a rectangular parallelepiped that is thin and flat in the front and back direction (the thickness direction of the housing 3, the Z direction). The housing 3 comprises a face $3a$ (a front face, a front face part) and a face $3b$ (a back face, a back face part) located opposite the face $3a$. The face $3a$ and the face $3b$ are provided substantially in parallel. The housing 3 comprises four ends $3c$ to $3f$ (sides, edges) and four corners $3g$ to $3j$ (pointed portions, bent portions, ends) viewed from the front. The ends $3c$ and $3e$ are examples of long sides. The ends $3d$ and $3f$ are examples of short sides.

The housing 3 comprises the wall $3k$ (a part, a plate, a frame, a front wall, a front face wall, a top wall) comprising the face $3a$, and a wall $3m$ (a part, a plate, a back wall, a rear face wall, a bottom wall) comprising the face $3b$. The walls $3k$ and $3m$ each have a quadrangular shape (a rectangular shape as an example, in the embodiment). The housing 3 comprises four walls 3n (a part, a plate, a side wall, an end wall, a standing wall, a surrounding part) each comprising a face 3p (a side face, a surrounding face) across the wall 3k and the wall 3m. An opening 3r in a quadrangular shape is provided on the wall 3k, for example.

Figure 3:
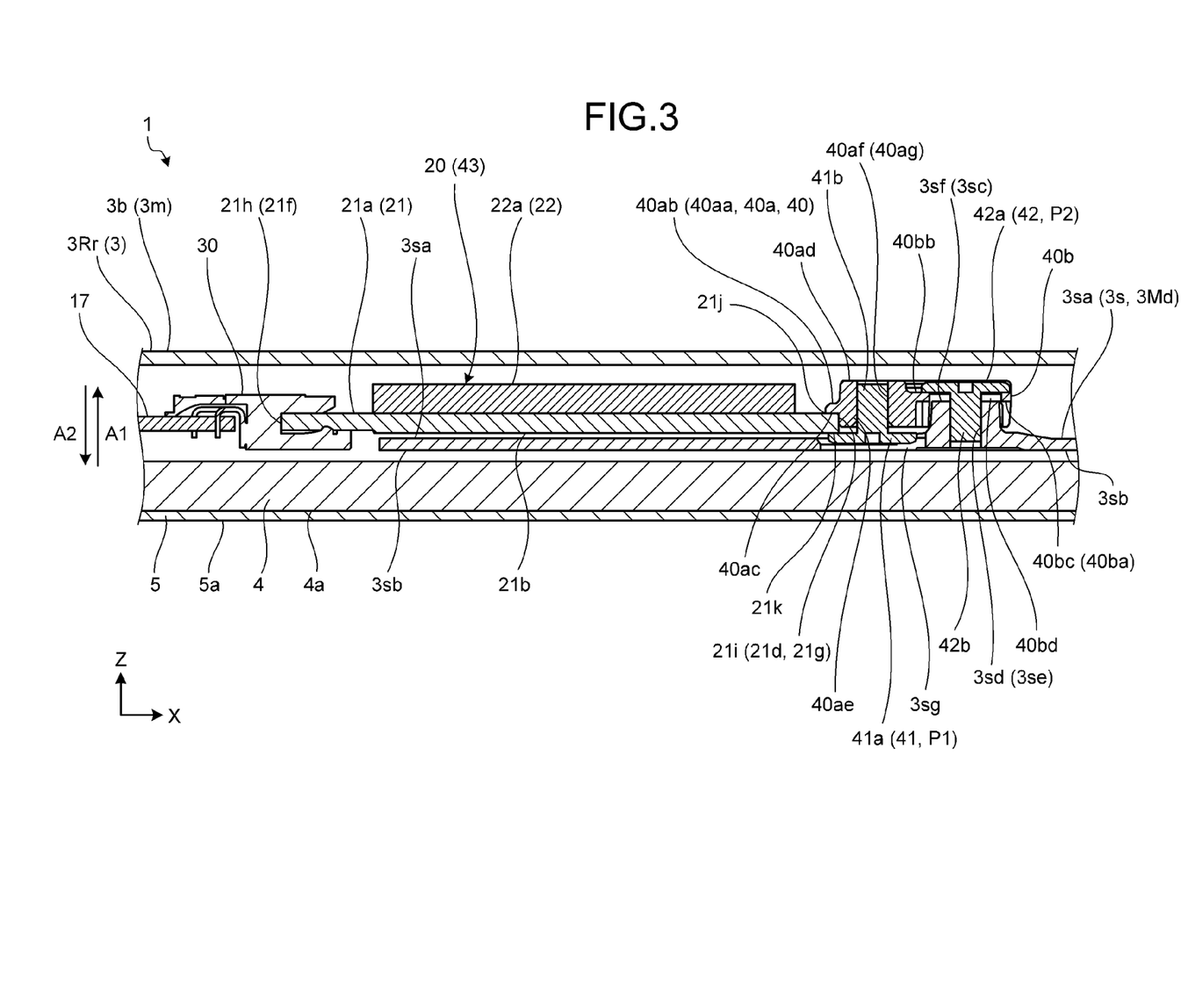
FIG. 3 is an exemplary cross-sectional view of the electronic device in the embodiment.
Figure 4:
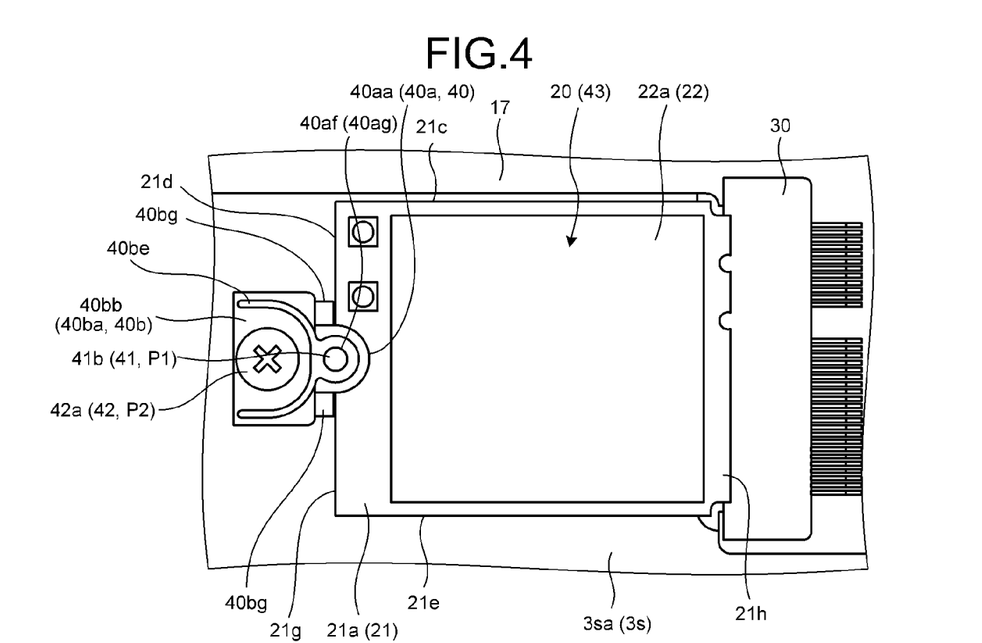
FIG. 4 is an exemplary view of a mounting structure of a module in the electronic device in the embodiment.
Figure 5:
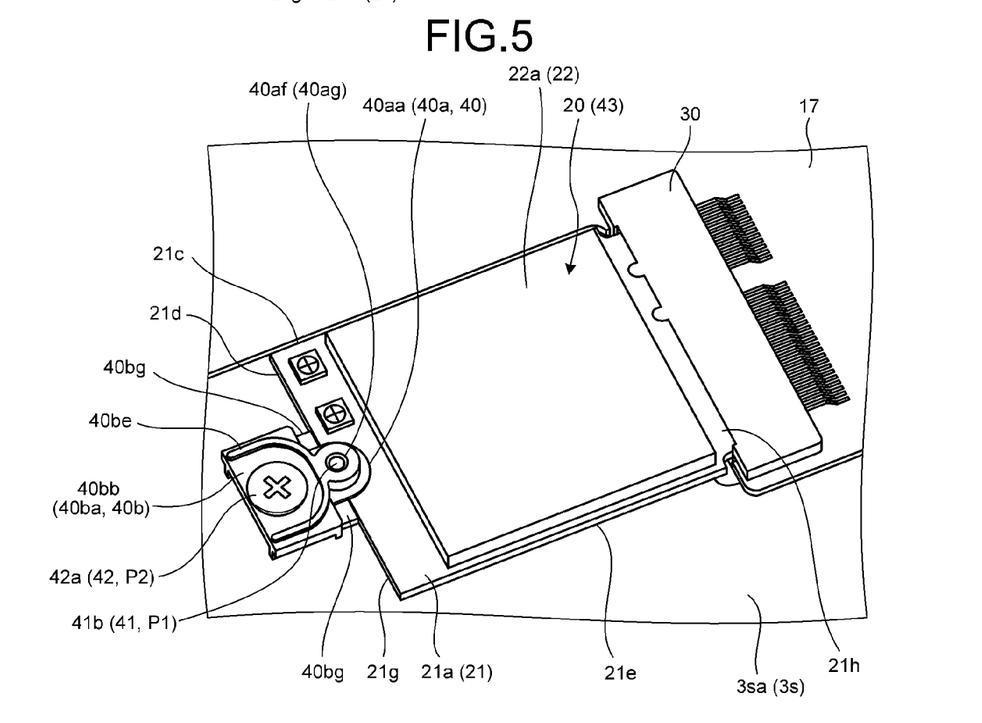
FIG. 5 is an exemplary perspective view of the mounting structure of the module in the electronic device in the embodiment.
Figure 6:
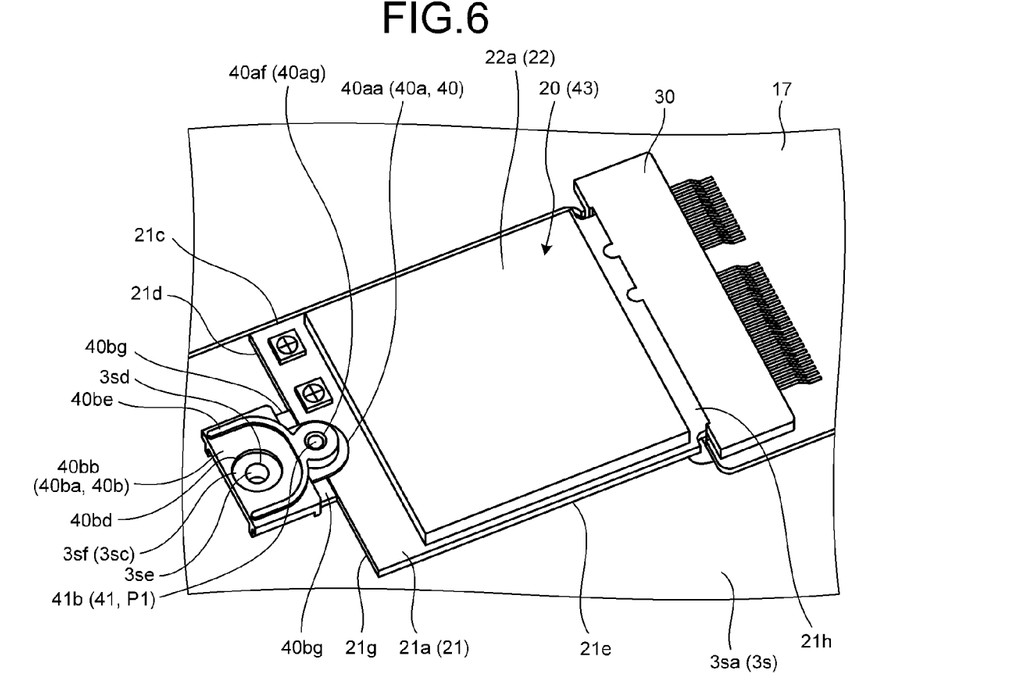
FIG. 6 is an exemplary perspective view of a portion of the mounting structure of the module in the electronic device in the embodiment.

In the present embodiment, as illustrated in FIG. 3, the housing 3 comprises a wall 3s, for example. The wall 3s is located between the wall 3k and the wall 3m and is provided facing inside the housing 3. The wall 3s is provided substantially in parallel with the wall 3k and the wall 3m. The thickness direction of the wall 3s is substantially the same as the thickness direction of the housing 3. The wall 3s is an example of a first wall. In FIG. 3, one side of the thickness direction of the wall 3s (the direction along the direction Z) is indicated by the arrow A1, and the other side of the thickness direction of the wall 3s is indicated by the arrow A2. In the descriptions below, unless otherwise specified, "one side" refers to one side in the thickness direction of the wall 3s and "another side" refers to another side in the thickness direction of the wall 3s.

The wall 3s comprises faces 3sa and 3sb. The face 3sa faces one side. The face 3sb is provided opposite the face 3sa and facing the other side. On the face 3sa, a boss 3sc is provided.

The boss 3sc protrudes from the face 3sa (the wall 3s) to the one side. The boss 3sc has a cylindrical shape (e.g., a cylinder) extending in the thickness direction of the wall 3s. In the boss 3sc, an opening 3sd is provided. The opening 3sd is opened toward at least the one side and along the thickness direction of the wall 3s. In the present embodiment, the opening 3sd is opened toward the one side and toward the other side in the thickness direction of the wall 3s, and along the thickness direction. The boss 3sc also comprises a female screw 3se. The female screw 3se surrounds at least a portion of the opening 3sd. That is, the opening 3sd is provided in the female screw 3se. In the present embodiment, the female screw 3se is provided across a tip end face 3sf (a tip end) of the boss 3sc and the face 3sb. The female screw 3se surrounds the whole of the opening 3sd. The boss 3sc is an example of a first base, the opening 3sd is an example of a first opening, and the female screw 3se is an example of a first female screw.

An opening 3sg is provided on the wall 3s. The opening 3sg is provided apart from the boss 3sc. The opening 3sg penetrates the wall 3s in the thickness direction of the wall 3s. The opening 3sg is an example of a fifth opening.

The housing 3 can comprise a plurality of components (segments) combined with each other. The housing 3 comprises a first member 3Fr (a front side member, a cover, a bezel, a frame) comprising at least the wall 3k, a second member 3Rr (a back side member, a base, a bottom, a plate) comprising at least the wall 3m, and a third member 3Md (an intermediate member, a plate, an intermediate wall, an inner wall, a middle plate, a middle frame) comprising at least the wall 3s.

The first member 3Fr is made of a synthetic resin material (an electric insulating material), for example. The second member 3Rr and the third member 3Md are made of a metallic material, for example, in the present embodiment. According to the present embodiment, weight saving and improvement of stiffness and strength of the housing 3 therefore are easily obtained at the same time. The combination of these materials (quality of materials) is only an example, and therefore combination of other materials can be used. For example, the second member 3Rr and the third member 3Md can also be made of a synthetic resin material.

A display device 4 (a display module, a display, a panel, a display component) is housed in the housing 3, for example, in the embodiment. Specifically, a display screen 4a located on the face 3a side of the display device 4 is exposed to the front (outside) of the housing 3 through the opening 3r. Users can visibly recognize the display screen 4a from the front side through the opening 3r. The display device 4 has an appearance of a quadrangular shape (a rectangular shape as an example, in the embodiment), viewed from the front of the display device 4. The display device 4 is a rectangular parallelepiped that is thin and flat in the front and back direction. The display device 4 is a liquid crystal display (LCD), an organic electro-luminescent display (OELD), and a plasma display panel (PDP), for example. In the present embodiment, the display device 4 is supported by the first member 3Fr.

An input operating panel 5 is provided on the front side (a front side, the wall 3k side) of the display device 4 in the embodiment. The input operating panel 5 is transparent and relatively thin and has a quadrangular shape. The input operating panel 5 is an electrostatic capacitive touch panel, for example, in the present embodiment. The input operating panel 5 comprises an operation face 5a touched by an operator for operation (operated). The operation face 5a is exposed from the opening 3r. The input operating panel 5 is supported by the first member 3Fr with its surface opposite from the operation face 5a placed over the display screen 4a.

A plurality of components (elements, electronic components, electrical components) such as a circuit board 17 are housed at the back side of the display device 4 (the rear side, the back rear side, the wall 3m side, the opposite side of the display screen 4a) in the housing 3, for example, in the present embodiment. The components mounted on the circuit board 17 (a board, a control board, a main board, an electrical component) constitute at least a portion of a control circuit (not illustrated). The control circuit may comprise an image signal processing circuit, a tuner, a High-Definition Multimedia Interface (HDMI) (registered trademark) signal processor, an audio video (AV) input port, a remote control signal receiver, a controller, a selector, an on-screen display interface, a storage (e.g., a read only memory (ROM), a random access memory (RAM), a hard disk drive (HDD)), an audio signal processing circuit, for example. The control circuit controls output of images (moving images and still images) on the display screen 4a of the display device 4, output of audio by a speaker (not illustrated), and emitting of a light emitting diode (LED) (not illustrated). The display device 4, the speaker, and the LED are examples of output parts. The display device 4 is electrically connected to the circuit board 17.

In addition to the circuit board 17, the followings are housed in the housing 3, for example, in the present embodiment: a battery (a cell, a battery pack), a camera module (a camera unit, a camera assembly, an image capturing device), a speaker module (a speaker unit, a speaker assembly, an audio output device), a connector module (a connector unit, a connector assembly, a connector device), an antenna module (an antenna unit, an antenna assembly, an antenna device), and a vibration generator (a motor with an eccentric weight on its rotating shaft). These electrical components are each electrically connected to the circuit board 17 and other electrical components through a wire (e.g., a cable, a flexible cable, a flexible printed-wiring board).

As illustrated in FIG. 3, a module 20 is housed in the housing 3 in the present embodiment. Examples of the module 20 (an electronic module, an electronic component) include a solid state drive (SSD) module, a 3G communications module, a wireless local area network (WLAN) communications module, a wireless gigabit (WiGig) communications module, and an antenna module. In the present embodiment, the module 20 complies with the next generation form factor (NGFF) standard. The module 20 is electrically connected to the circuit board 17 through a connector 30.

Figure 7:
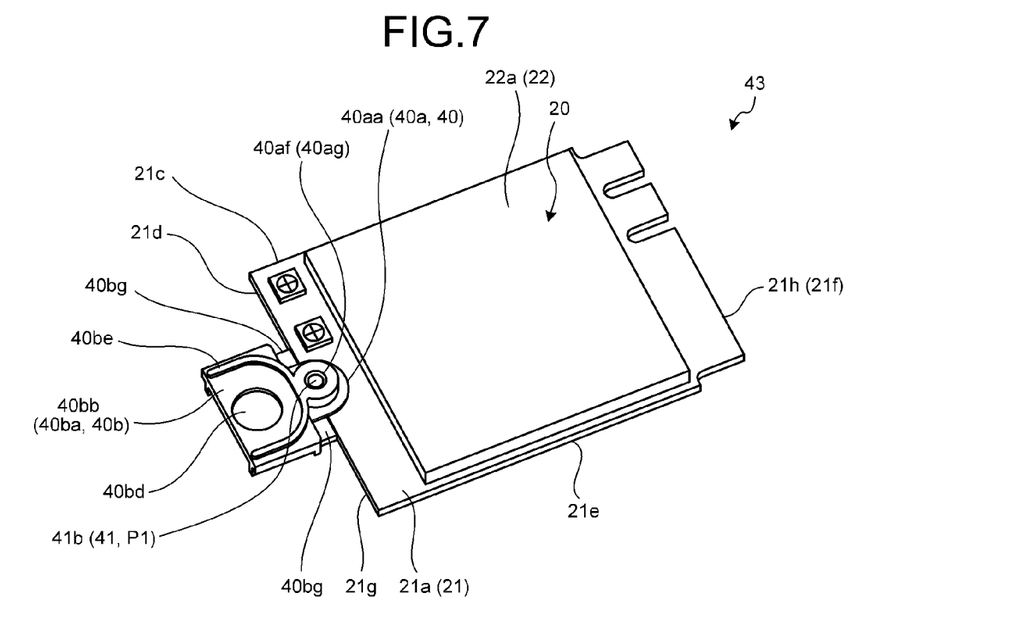
FIG. 7 is an exemplary perspective view of a sub-assembly including the module and a mounting member in the electronic device in the embodiment.
Figure 8:
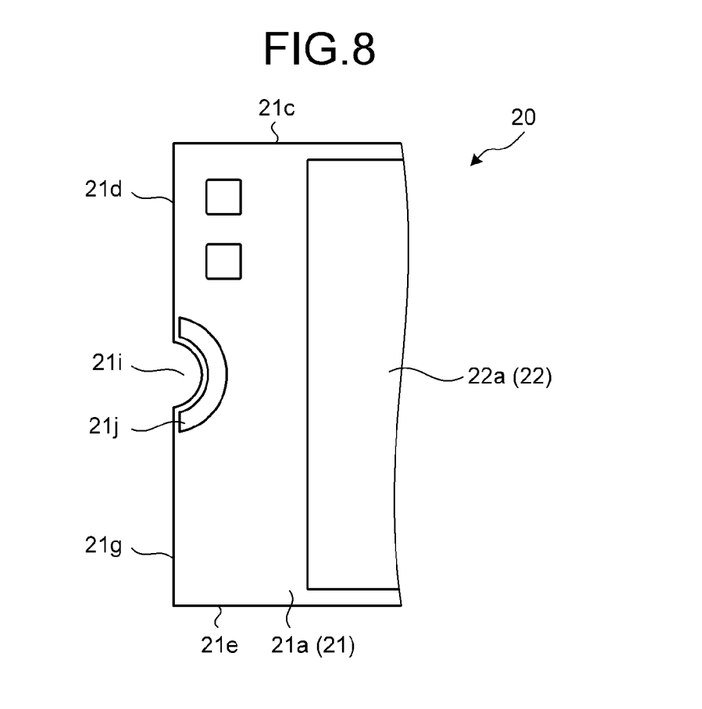
FIG. 8 is an exemplary view of the module in the electronic device when viewed from one side thereof, in the embodiment.
Figure 9:
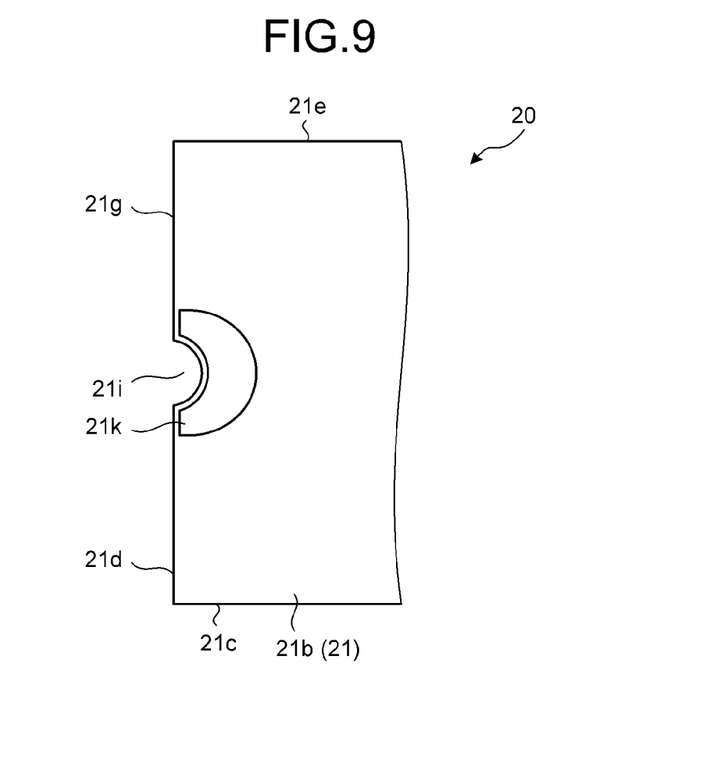
FIG. 9 is an exemplary view of the module in the electronic device when viewed from another side thereof, in the embodiment.

As illustrated in FIGS. 4 to 7, the module 20 comprises a circuit board 21 and an electronic component 22 (a mounted component). The circuit board 21 has an appearance of a substantially quadrangular shape (a rectangular shape as an example, in the embodiment) viewed from the front. As illustrated in FIG. 3, the circuit board 21 comprises a face 21*a* and a face 21*b*. The face 21*a* and the face 21*b* are provided substantially in parallel with each other. The face 21*a* faces the one side. The face 21*a* is a mounting surface. The face 21*b* is provided opposite the face 21*a* and faces the other side. The face 21*a* is not a mounting surface. That is, the circuit board 21 can be called a one-surface mounting board. The circuit board 21 comprises four ends 21*c* to 21*f* (sides, edges, FIG. 7) viewed from the front side. The ends 21*c* and 21*e* are examples of long sides. The ends 21*d* and 21*f* are examples of short sides. The ends 21*c* to 21*f* define the edge 21*g* of the circuit board 21. In the end 21*f*, a connector 21*h* is provided (FIG. 7). As illustrated in FIGS. 8 and 9, in the circuit board 21, an opening 21*i* is provided. The opening 21*i* is provided at the end 21*d*. The opening 21*i* is a notch, for example. The opening 21*i* penetrates the face 21*a* and the face 21*b* and opens in the direction orthogonal to the thickness direction of the circuit board 21. The opening 21*i* has a substantially semicircular shape when viewed from the front. In the faces 21*a* and 21*b*, electrode pads 21*j* and 21*k* for grounding (a conductive portion, a grounding part, an electrode) are provided, respectively. The electrode pads 21*j* and 21*k* are each provided in the periphery of the opening 21*i* along the opening 21*i*. The electrode pads 21*j* and 21*k* each have a belted arc-shape extending along the opening 21*i*. The electrode pad 21*k* is larger than the electrode pad 21*j*. The electrode pad 21*k* has the width of its intermediate part larger than the width of each of the ends thereof. The circuit board 21 is an example of a third wall and the opening 21*i* is an example of a fourth opening.

As illustrated in FIGS. 3 and 7, the electronic component 22 is mounted on the face 21*a*. The outer shape of the electronic component 22 viewed from the front is smaller than that of the circuit board 21 viewed from the front. The electronic component 22 comprises a body 22*a* (an outer shell, a housing, a frame). The body 22*a* has a rectangular parallelepiped shape. Various components (members) are embedded in the body 22*a*.

The following describes the mounting structure of the module 20. As illustrated in FIG. 3, the end 21*d* of the module 20 is combined with the boss 3*sc* by a mounting member 40, and the end 21*f* (the connector 21*h*) of the module 20 is combined with the connector 30. The circuit board 21 and the boss 3*sc* are provided side by side in the direction along the face 3*sa*.

Figure 10:
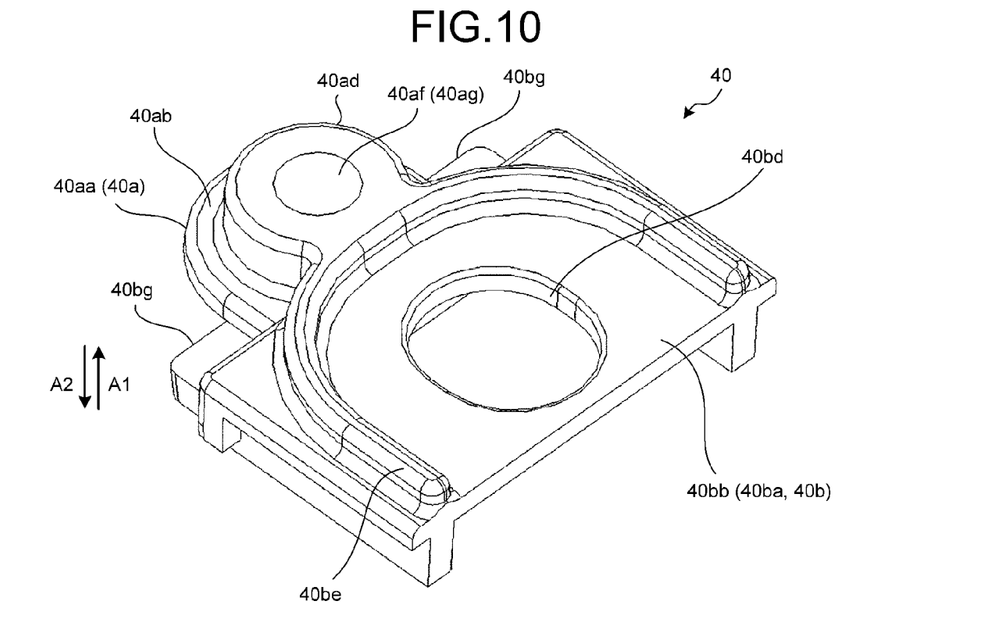
FIG. 10 is an exemplary perspective view of the mounting member in the electronic device in the embodiment.
Figure 11:
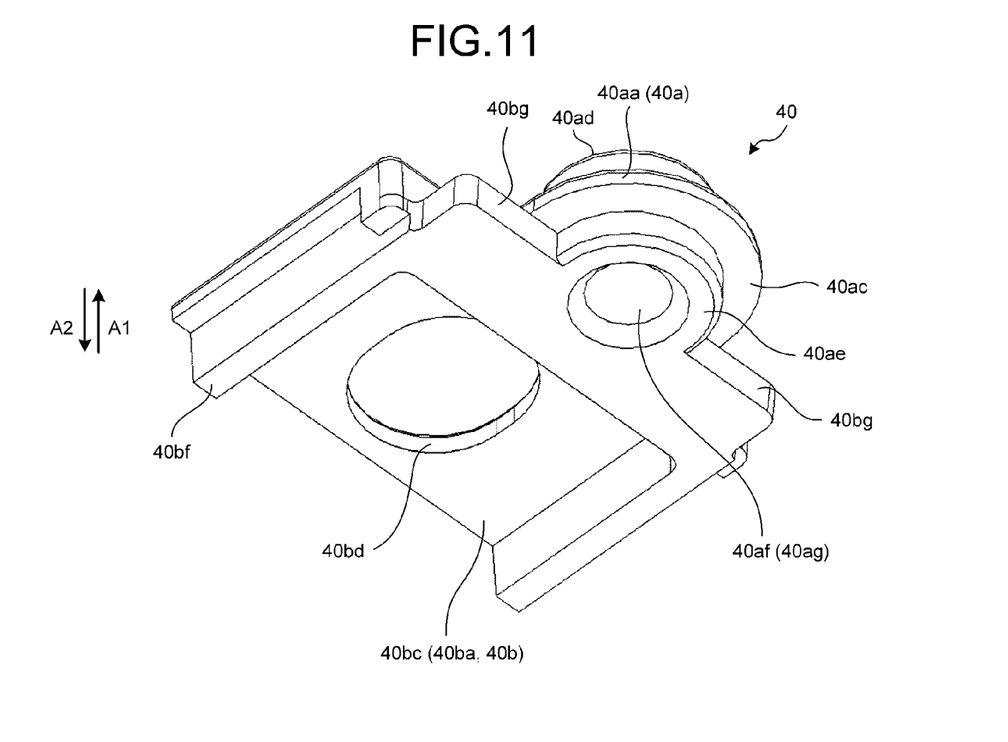
FIG. 11 is an exemplary perspective view of the mounting member in the electronic device when viewed from a side opposite from that of FIG. 10, in the embodiment.

As illustrated in FIGS. 10 and 11, the mounting member 40 comprises two combining portions 40*a* and 40*b*. As illustrated in FIG. 3, the combining portion 40*a* is combined with the circuit board 21 by a combining portion 41 and the combining portion 40*b* is combined with the boss 3*sc* by a combining portion 42. The mounting member 40 comprises an electrically conductive member, for example. Examples of the electrically conductive member include metal materials such as aluminum and stainless steel. The combining portion 41 is an example of a first combining portion and the combining portion 42 is an example of a second combining portion.

The combining portion 40*a* comprises a base 40*aa*. The base 40*aa* is placed over the electrode pad 21*j* on the face 21*a* of the circuit board 21. The base 40*aa* and the electrode pad 21*j* are electrically connected to each other. The base 40*aa* and the body 22*a* are provided with a gap interposed therebetween. The base 40*aa* comprises a face 40*ab* facing the one side and a face 40*ac* facing the other side. A protruding portion 40*ad* and a protruding portion 40*ae* are provided on the face 40*ab* and the face 40*ac*, respectively. The protruding portion 40*ad* protrudes from the face 40*ab* to the one side and the protruding portion 40*ae* protrudes from the face 40*ac* to the other side. On the base 40*aa* (the combining portion 40*a*), an opening 40*af* is provided. The opening 40*af* and the boss 3*sc* are provided with a gap interposed therebetween. The opening 40*af* penetrates the base 40*aa* and the protruding portions 40*ad* and 40*ae*. The opening 40*af* opens at least to the other side in the thickness direction of the wall 3*s* along the thickness direction. In the present embodiment, the opening 40*af* opens to the one side and the other side in the thickness direction of the wall 3*s* along the thickness direction. On the base 40*aa*, a female screw 40*ag* is provided. The female screw 40*ag* surrounds at least a portion of the opening 40*af*. In the present embodiment, the female screw 40*ag* is provided across the protruding portion 40*ad* and the protruding portion 40*ae*. The female screw 40*ag* surrounds the whole of the opening 40*af*. The base 40*aa* is an example of a second base, the opening 40*af* is an example of a second opening, and the female screw 40*ag* is an example of a second female screw.

The protruding portion 40*ae* is inserted into the opening 21*i* of the circuit board 21 and contacts the end 21*d* (an edge 21*g*), thereby regulating the relative movement of the mounting member 40 and the module 20. Specifically, the protruding portion 40*ae* regulates the relative movement between the mounting member 40 and the module 20 in the direction orthogonal to the thickness direction of the circuit board 21 (the thickness direction of the wall 3*s*). On this occasion, the opening 21*i* is located on the other side of the base 40*aa* and placed over the opening 40*af*. The protruding portion 40*ae* is an example of a first regulator.

As illustrated in FIGS. 10 and 11, the combining portion 40*b* comprises a wall 40*ba*. The wall 40*ba* extends from the one side of the base 40*aa* to the one side of the boss 3*sc* (FIG. 3). Specifically, the wall 40*ba* extends from the protruding portion 40*ad* to the one side of the boss 3*sc*. The wall 40*ba* is placed over the tip end face 3*sf* of the boss 3*sc*. The wall 40*ba* comprises faces 40*bb* and 40*bc*. The face 40*bb* faces the one side and the face 40*bc* is provided opposite the face 40*bb* and faces the other side. The wall 40*ba* comprises an opening 40*bd*. The opening 40*bd* penetrates the faces 40*bb* and 40*bc*. That is, the opening 40*bd* penetrates the wall 40*ba* in the thickness direction of the wall 40*ba*. The opening 40*bd* overlaps with the opening 3*sd* of the boss 3*sc*. The opening 40*bd* is an example of a third opening.

A protruding portion 40*be* (a rib, FIG. 10) is provided on the face 40*bb*. The protruding portion 40*be* protrudes from the face 40*bb* to the one side. The protruding portion 40*be* is located around the opening 40*bd*, protrudingly formed toward the one side of the base 40*aa*, and connected to the combining portion 40*a* (the protruding portion 40*ad*).

A protruding portion 40*bf* (a rib, refer to FIG. 11) is provided on the face 40*bc*. The protruding portion 40*bf* protrudes from the face 40*bc* to the other side. The protruding portion 40*bf* is located around the opening 40*bd*, protrudingly formed toward the base 40*aa*, and connected to the combining portion 40*a*.

On the side of the combining portion 40*a* (the base 40*aa*) of the protruding portion 40*bf*, a pair of bulged portions 40*bg* is provided. The protruding portion 40*ae* is located between the pair of bulged portions 40*bg*. The bulged portions 40*bg* face the end 21d (the edge 21g) of the circuit board 21. Any gap may exist between the bulged portions 40bg and the end 21d.

As illustrated in FIG. 3, the combining portion 41 penetrates through the opening 21i on the circuit board 21 and is inserted into the opening 40af of the combining portion 40a so as to combine the module 20 and the mounting member 40 with each other. Specifically, the combining portion 41 is an external male screw member and comprises a head 41a and a shaft 41b. The head 41a is located on the other side of the base 40aa and placed over the electrode pad 21k (the face 21b) on the circuit board 21. The shaft 41b comprises an external thread. The shaft 41b extends from the head 41a, penetrates through the opening 21i, and is inserted into the opening 40af. Accordingly, the combining portion 41 is combined with the female screw 40ag. The portion around the opening 21i (the electrode pad 21k) on the circuit board 21 is sandwiched between the base 40aa and the combining portion 41. This operation combines the base 40aa and the circuit board 21 with each other. On this occasion, the head 41a and the electrode pad 21k are electrically connected to each other, and the shaft 41b and the base 40aa are electrically connected to each other. The head 41a is inserted into the opening 3sg of the wall 3s. The head 41a is an example of a first head and the shaft 41b is an example of a first shaft.

The combining portion 42 penetrates through the opening 40bd on the wall 40ba and is inserted into the opening 3sd of the boss 3sc to combine the mounting member 40 and the boss 3sc with each other. Specifically, the combining portion 42 is an external male screw member and comprises a head 42a and a shaft 42b. The head 42a is located on the one side of the boss 3sc and placed over the face 40bb of the wall 40ba. The shaft 42b comprises the external male screw. The shaft 42b extends from the head 42a, penetrates through the opening 40bd, and is inserted into the opening 3sd. Accordingly, the combining portion 42 is combined with the female screw 3se. The wall 40ba is sandwiched between the combining portion 42 and the boss 3sc. This operation combines the wall 40ba and the boss 3sc with each other. The diameter of the opening 40bd on the wall 40ba is larger than that of the shaft 42b of the combining portion 42 by a certain amount so that the form errors and the mounting errors can be absorbed. The head 42a is an example of a second head and the shaft 42b is an example of a second shaft.

The following describes a mounting method of the module 20 in the electronic device 1. As illustrated in FIG. 7, the circuit board 21 and the mounting member 40 are combined with each other by the combining portion 41. Specifically, the face 21a of the circuit board 21 is placed over the base 40aa (the face 40ac) of the mounting member 40, and the protruding portion 40ae of the mounting member 40 is inserted into the opening 21i on the circuit board 21. On this occasion, the protruding portion 40ae contacts the edge 21g of the circuit board 21, thereby regulating the relative movement between the mounting member 40 and the module 20 in the direction orthogonal to the thickness direction of the circuit board 21 (the thickness direction of the wall 3s). In addition, the bulged portions 40bg contact the edge 21g of the circuit board 21, thereby regulating the relative rotation of the mounting member 40 and the module 20. Thereafter, the combining portion 41 is inserted into the opening 21i and the opening 40af from the side of the face 40ac (one direction with respect to the mounting member 40) rather than the face 40ab of the mounting member 40, whereby the combining portion 41 is combined with the female screw 40ag on the mounting member 40. This achieves a sub-assembly 43 in which the circuit board 21 and the mounting member 40 are integrated with each other. The bulged portions 40bg are examples of a second regulator.

The connector 21h of the circuit board 21 is combined with the connector 30 so that the face 21a of the circuit board 21 faces the one side and the face 21b of the circuit board 21 faces the other side.

Subsequently, the mounting member 40 and the boss 3sc are combined with each other by the combining portion 42. Specifically, the face 40bc of the mounting member 40 is placed over the tip end face 3sf of the boss 3sc. After that, the combining portion 42 is inserted into the opening 40bd and the opening 3sd from the side of the face 40bb (the other direction opposite the one direction with respect to the mounting member 40) rather than the face 40bc of the mounting member 40, thereby engaging the combining portion 42 and the female screw 3se on the boss 3sc. With the above-described operations, the module 20 is mounted to the boss 3sc and the connector 30.

As described above, in the mounting method of the module 20 in the electronic device 1 according to the embodiment, the module 20 and the mounting member 40 for mounting the module 20 in the housing 3 of the electronic device 1 is firstly integrated with each other by the combining portion 41 that moves from the one direction to the combining position P1. Subsequently, the sub-assembly 43 in which the mounting member 40 and the module 20 are integrated with each other and the wall 3s facing inside of the housing 3 are integrated with each other by the combining portion 42 that moves from the direction opposite the one direction to the combining position P2 so that at least a portion of the combining portion 41 is placed over at least a portion of the combining portion 42 in a direction orthogonal to the one direction. The combining positions P1 and P2 are the positions of the combining portions 41 and 42, respectively, with respect to the mounting member 40. The combining position P1 is an example of a first combining position and the combining position P2 is an example of a second combining position.

As described above, in the present embodiment, the module 20 is mounted to the boss 3sc by the mounting member 40 and the combining portions 41 and 42. The opening 40af (the second opening) is provided on the base 40aa (the second base) of the mounting member 40. The opening 40af is spaced apart from the boss 3sc (the first base) and opens at least toward the other side in the thickness direction of the wall 3s (the first wall) and along the thickness direction. The wall 40ba (the second wall) of the mounting member 40 extends from one side of the base 40aa located further from the wall 3s in the thickness direction of the wall 3s to one side of the boss 3sc located away from the wall 3s in the thickness direction. On the wall 40ba, the opening 40bd (the third opening) is provided overlapping with the opening 3sd (the first opening). The opening 21i (the fourth opening) is provided on the circuit board 21 (the third wall) of the module 20 and the opening 21i is located at another side of the base 40aa located nearer to the wall 3s in the thickness direction of the wall 3s and placed over the opening 40af. The combining portion 41 (the first combining portion) penetrates through the opening 21i and is inserted into the opening 40af to combine the module 20 and the mounting member 40 with each other. The combining portion 42 (the second combining portion) penetrates through the opening 40bd and is inserted into the opening 3sd, thereby combining the mounting member 40 and the boss 3sc with each other. With this operation, the face 21b of the circuit board 21 is located nearer to the other side than the tip end face 3sf of the boss 3sc, thereby readily achieving a reduction of the thickness of the housing 3 in comparison to the configuration in which the circuit board 21 is placed over the tip end face 3sf of the boss 3sc.

In the present embodiment, the head 41a (the first head) of the combining portion 41 is located at the other side of the base 40aa; and the shaft 41b (the first shaft) of the combining portion 41 extends from the head 41a, penetrates through the opening 21i, and is inserted into the opening 40af. The head 42a (the second head) of the combining portion 42 is located at the one side of the boss 3sc; and the shaft 42b (the second shaft) of the combining portion 42 extends from the head 42a, penetrates through the opening 40bd, and is inserted into the opening 3sd. That is, the attitude of the combining portion 41 is opposite from that of the combining portion 42. This configuration readily reduces the gap between the combining portion 41 and the combining portion 42, thereby readily downsizing the mounting member 40.

In the present embodiment, the head 41a is inserted into the opening 3sg of the wall 3s. This configuration readily achieves a reduction of the thickness of the housing 3.

In the present embodiment, the protruding portion 40be is provided around the face 40bb on the one side of the wall 40ba. The protruding portion 40be is located around the opening 40bd and protrudingly formed toward the one side of the base 40aa. This configuration improves the strength and rigidity of the mounting member 40.

In the present embodiment, the mounting member 40 is formed of an electrically conductive material. The module 20 is therefore electrically connected to the boss 3sc by the mounting member 40, whereby the module 20 is grounded.

In the present embodiment, the protruding portion 40ae (the first regulator) is provided on the mounting member 40. The protruding portion 40ae is inserted into the opening 21i and contacts the edge 21g, thereby regulating the relative movement of the mounting member 40 and the module 20. This configuration regulates the movement of the module 20 toward the mounting member 40.

In the present embodiment, the circuit board 21 and the boss 3sc are provided side by side in the direction along the face 3sa on the one side of the wall 3s. This configuration readily achieves a reduction of the thickness of the housing 3.

In the present embodiment, the connector 30 is housed in the housing 3 and combined with the part (the end 21f) of the circuit board 21 opposite the mounting member 40. This configuration supports both the ends 21d and 21f on the circuit board 21 that are located on the opposite side from each other. This configuration facilitates a stable mounting of the module 20.

In the present embodiment, the bulged portions 40bg (second regulators) contact the edge 21g of the circuit board 21, thereby regulating the relative rotation (around the combining portion 41) of the mounting member 40 and the module 20. This operation enables regulation of the rotation of the mounted module 20 with respect to the mounting member 40.

Moreover, the various modules of the systems described herein can be implemented as software applications, hardware and/or software modules, or components on one or more computers, such as servers. While the various modules are illustrated separately, they may share some or all of the same underlying logic or code.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An electronic device comprising:
    a housing;
    a first wall in the housing;
    a first base protruding from the first wall in a thickness direction of the first wall, the first base comprising a first opening along the thickness direction;
    a mount comprising:
        a second base spaced apart from the first base, the second base comprising a second opening toward the first wall and along the thickness direction; and
        a second wall extending from one side of the second base located farther from the first wall in the thickness direction to one side of the first base located farther from the first wall in the thickness direction, the second wall comprising a third opening which overlaps with the first opening;
    a module comprising:
        a third wall located at another side of the second base located nearer to the first wall in the thickness direction, the third wall comprising a fourth opening which overlaps with the second opening; and
        a body spaced apart from the second base;
    a first combining portion penetrating through the fourth opening and inserted into the second opening, and configured to combine the module and the mount with each other; and
    a second combining portion penetrating through the third opening and inserted into the first opening, and configured to combine the mount and the first base with each other.

2. The electronic device of claim 1, wherein
    the first base comprises a first female screw surrounding at least a portion of the first opening,
    the second base comprises a second female screw surrounding at least a portion of the second opening,
    the first combining portion comprises:
        a first head located at the other side of the second base; and
        a first shaft extending from the first head, penetrating through the fourth opening, inserted into the second opening, and combined with the second female screw, and
    the second combining portion comprises:
        a second head located at the one side of the first base; and
        a second shaft extending from the second head, penetrating through the third opening, inserted into the first opening, and combined with first female screw.

3. The electronic device of claim 2, wherein the first wall comprises a fifth opening configured to receive the first head.

4. The electronic device of claim 2, wherein a protruding portion is formed on a surface of the second wall at one side located farther from the first wall in the thickness direction, the protruding portion located around the third opening and protrudingly formed toward one side of the second base.

5. The electronic device of claim 1, wherein the mount is an electrically conductive material.

6. The electronic device of claim 1, wherein
    the fourth opening is a notch on an edge of the third wall, and
    a part around the fourth opening on the third wall is sandwiched between the first combining portion and the second base.

7. The electronic device of claim 6, wherein a first regulator formed with the mount that is inserted into the fourth opening, is in contact with the edge, and regulates the relative movement of the mount and the module.

8. The electronic device of claim 1, wherein the third wall and the first base are side by side in a direction along a surface at one side of the first wall.

9. The electronic device of claim 1, farther comprising a connector in the housing and combined with a part of the third wall at a side opposite from the mount.

10. The electronic device of claim 1, wherein the mount comprises a second regulator configured to in contact with an edge of the third wall, and to regulate relative rotation of the mount and the module.

11. A mount in an electronic device, the electronic device comprising a housing, a first wall in the housing, a first base, and a module in the housing, the first base protruding from the first wall in a thickness direction of the first wall, the first base comprising a first opening along the thickness direction, the mount comprising:

a second base spaced apart from the first base, the second base comprising a second opening toward the first wall and along the thickness direction; and     a second wall extending from one side of the second base located farther from the first wall in the thickness direction to one side of the first base located farther from the first wall in the thickness direction, the second wall comprising a third opening which overlaps with the first opening, wherein     the second opening overlaps with a fourth opening on a third wall of the module and located at another side of the second base located nearer to the first wall in the thickness direction,     the second base is spaced apart from a body of the module,     the second base is combined with the module by a first combining portion penetrating through the fourth opening and inserted into the second opening, and     the second wall is combined with the first base by a second combining portion penetrating through the third opening and inserted into the first opening.

12. A mount method of a module in an electronic device, the mount method comprising:

integrating a module and a mount configured to mount the module to a housing of the electronic device by a first combining portion configured to move in a first direction to a first combining position; and     integrating a sub-assembly in which the mount and the module are integrated to the housing by a second combining portion configured to move in a second direction opposite the first direction to a second combining position so that at least a portion of the first combining portion and at least a portion of the second combining portion overlap each other in a direction orthogonal to the first direction.

* * * * *